United States Patent
Zhou

(10) Patent No.: US 10,727,130 B2
(45) Date of Patent: Jul. 28, 2020

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/849,143

(22) Filed: Dec. 20, 2017

(65) Prior Publication Data

US 2018/0182626 A1    Jun. 28, 2018

(30) Foreign Application Priority Data

Dec. 22, 2016    (CN) .......................... 2016 1 1200251

(51) Int. Cl.
*H01L 21/8234* (2006.01)
*H01L 27/088* (2006.01)
*H01L 29/66* (2006.01)
*H01L 29/78* (2006.01)

(52) U.S. Cl.
CPC .... *H01L 21/823418* (2013.01); *H01L 27/088* (2013.01); *H01L 27/0886* (2013.01); *H01L 29/6659* (2013.01); *H01L 29/7833* (2013.01)

(58) Field of Classification Search
CPC .................. H01L 21/823418; H01L 29/66492
See application file for complete search history.

(56) References Cited

U.S. PATENT DOCUMENTS 4,420,344 A    12/1983    Davies et al.
2008/0142849 A1    6/2008    Alvarez et al.
(Continued)

FOREIGN PATENT DOCUMENTS

CN    101207085 A    6/2008
CN    104701260 A    6/2015
(Continued)

OTHER PUBLICATIONS

The European Patent Office (EPO) The Extended European Search Report for 17207916.2 May 11, 2018 11 Pages.

*Primary Examiner* — Daniel P Shook
(74) *Attorney, Agent, or Firm* — Anova Law Group, PLLC

(57) ABSTRACT

A semiconductor device and a fabrication method are provided. The fabrication method includes providing a base substrate including a core region having a first gate structure formed thereon, and an edge region having a second gate structure formed thereon; forming a source/drain doped layer, in the core region of the base substrate on both sides of the first gate structure, and in the edge region of the base substrate on both sides of the second gate structure, respectively, the source/drain doped layer including first ions; and doping the second ions in the source/drain doped layer in the edge region, the second ions having a conductivity type opposite to the first ions.

20 Claims, 3 Drawing Sheets

(56) References Cited

U.S. PATENT DOCUMENTS

2011/0294270 A1* 12/2011 Nishisaka .............. B82Y 10/00
                                                    438/197
2013/0011983 A1*  1/2013 Tsai ................ H01L 21/823807
                                                    438/285
2013/0122676 A1   5/2013 Jeng
2014/0183630 A1   7/2014 Hao et al.

FOREIGN PATENT DOCUMENTS

EP         1026738 A2 *  8/2000
EP         1026738 A2    8/2000

* cited by examiner

SEMICONDUCTOR DEVICE AND FABRICATION METHOD THEREOF

CROSS-REFERENCES TO RELATED APPLICATIONS

This application claims the priority of Chinese patent application No. 201611200251.X, filed on Dec. 22, 2016, the entirety of which is incorporated herein by reference.

FIELD OF THE DISCLOSURE

The present disclosure generally relates to the field of semiconductor manufacturing technologies and, more particularly, relates to a semiconductor device and a fabrication method thereof.

BACKGROUND

MOS transistors are one of the most important components in modern integrated circuits. The basic structure of a MOS transistor includes a semiconductor substrate, a gate structure on the surface of the semiconductor substrate, a source region in the semiconductor substrate located on one side of the gate structure, and a drain region in the semiconductor substrate located on the other side of the gate structure. The MOS transistor operates according to the following principle: a switching signal is generated by applying a voltage on the gate structure and adjusting the electric current in the channel region under the gate structure.

With the development of semiconductor technologies, the controlling ability of the traditional planar MOS transistor on the channel current becomes weaker, causing a severe leakage current phenomenon. The fin field effect transistor (FinFET) is a new multi-gate device that typically includes a plurality of fins protruding from the surface of the semiconductor substrate, a gate structure covering a portion of the top and sidewall surfaces of the fins, a source region in the fins on one side of the gate structure, and a drain region in the fins on the other side of the gate structure.

However, the process of forming a semiconductor device, such as a planar MOS transistor or a FinFET, is quite complicated. The disclosed semiconductor device and method are directed to solve one or more problems set forth above and other problems in the art.

BRIEF SUMMARY OF THE DISCLOSURE

One aspect of the present disclosure includes a method for fabricating a semiconductor device. The fabrication method includes: providing a base substrate including a core region having a first gate structure formed thereon, and an edge region having a second gate structure formed thereon; forming a source/drain doped layer in the core region of the base substrate and on both sides of the first gate structure, and in the edge region of the base substrate and on both sides of the second gate structure, respectively, the source/drain doped layer having first ions; doping the second ions in the source/drain doped layer in the edge region, the second ions having a conductivity type opposite to the first ions. The fabrication method simplifies the process of forming a semiconductor device.

Another aspect of the present disclosure includes a semiconductor device. The semiconductor device includes a base substrate including a core region having a first gate structure formed thereon, and an edge region having a second gate structure formed thereon; a first source/drain doped layer on both sides of the first gate structure and in the core region of the base substrate, the first source/drain doped layer having first ions; and a second source/drain doped layer on both sides of the second gate structure and in the edge region of the base substrate. The second source/drain doped layer includes the first ions and second ions having a conductivity opposite to the first ions.

Other aspects of the present disclosure can be understood by those skilled in the art in light of the description, the claims, and the drawings of the present disclosure.

DETAILED DESCRIPTION

Figure 1:
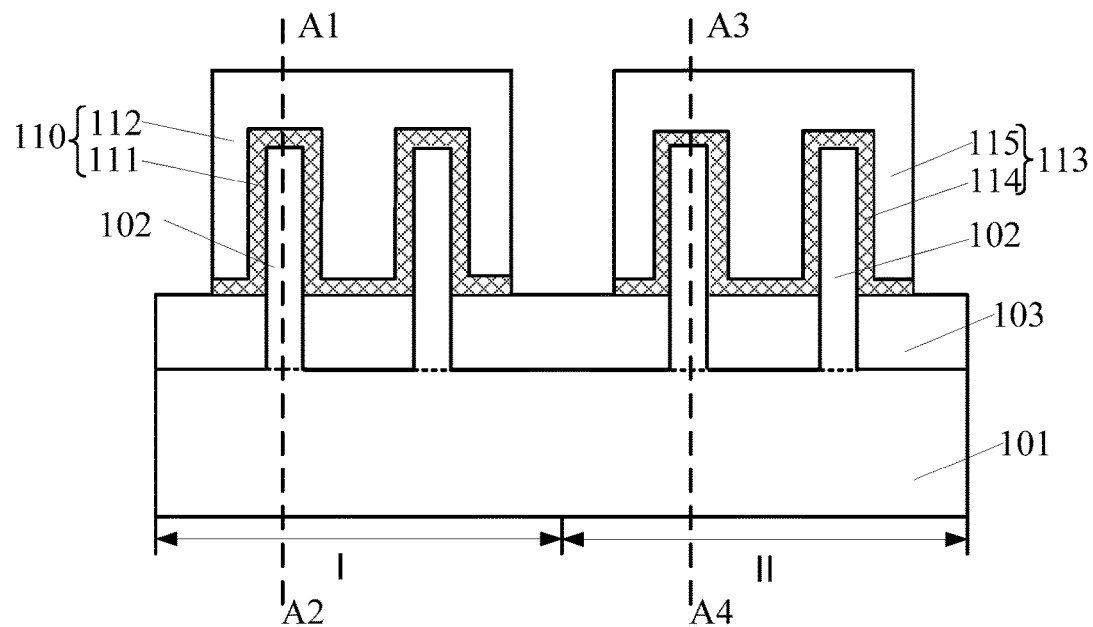
FIGS. 1-4 illustrate schematic structural views of a semiconductor device corresponding to certain stages of the fabrication process consistent with various disclosed embodiment.

Reference will now be made in detail to the exemplary embodiments of the disclosure, which are illustrated in the accompanying drawings. Wherever possible, the same reference numbers will be used throughout the drawings to refer to the same or similar parts.

When forming a semiconductor device, a semiconductor substrate may include a core region and an edge region. A first gate structure is formed in the core region of the semiconductor substrate, and a second gate structure is formed in the edge region of the semiconductor substrate. A first source/drain doped layer is formed in the core region of the semiconductor substrate and on both sides of the first gate structure and a second source/drain doped layer is formed in the edge region of the semiconductor substrate and on both sides of the second gate structure.

The ion concentration in the second source/drain doped layer needs to be smaller than the ion concentration in the first source/drain doped layer to avoid the tunneling leakage current problem occurring between the source/drain doped layer in the edge region and the semiconductor substrate in the edge region. In particular, the ion concentration in the second source/drain doped layer needs to be smaller than the ion concentration in the first source/drain doped layer, making the concentration gradient between the source/drain doped layer in the edge region and the channel region smaller than the concentration gradient between the source/drain doped layer in the core region and the channel region. Correspondingly, the width of the depletion layer formed by the source/drain doped layer in the edge region and the channel region is larger than the width of the depletion layer formed by the source/drain doped layer in the core region and the channel region. When the driving voltage of the semiconductor device in the edge region is larger than the driving voltage of the semiconductor device in the core region, the transverse electric field between the source/drain doped layer in the edge region and the channel region is not too large, and the tunneling leakage current problem occurring between the source/drain doped layer in the edge region and the semiconductor substrate in the edge region can be avoided.

However, such process of forming the semiconductor device is complicated.

Forming the second source/drain doped layer includes forming a first barrier layer covering the first gate structure and the semiconductor substrate in the core region, and exposing the second gate structure and the semiconductor substrate in the edge region; using the first barrier layer as a mask to form the second source/drain doped layer in the edge region of the semiconductor substrate and on both sides of the second gate structure; and removing the first barrier layer after forming the second source/drain doped layer.

Forming the first source/drain doped layer includes forming a second barrier layer covering the second gate structure and the semiconductor substrate in the edge region, and exposing the first gate structure and the semiconductor substrate in the core region; using the second barrier layer as a mask to form a first source/drain doped layer in the core region of the semiconductor substrate and on both sides of the first gate structure; and removing the second barrier layer after forming the first source/drain doped layer.

As such, the first source/drain doped layer and the second source/drain doped layer are formed separately in different processes. The process of forming the first barrier layer and removing the first barrier layer needs to be performed during the formation of the second source/drain doped layer, and the process of forming the second barrier layer and removing the first barrier layer needs to be performed during the formation of the first source/drain doped layer. The formation of the first barrier layer and the second barrier layer needs two deposition processes, two photolithography mask processes, and two etching processes, and removing the first barrier layer and the second barrier layer needs two etching processes. Thus, the process of forming the first source/drain doped layer and the second source/drain doped layer includes at least two deposition processes, two photolithography mask processes, and four etching processes. The process of forming the first source/drain doped layer and the second source/drain doped layer is very complicated, resulting in a quite complicated process of forming the semiconductor device.

The present disclosure provides a semiconductor device and a method for forming the semiconductor device. For example, a base substrate is provided, and the base substrate includes a core region and an edge region. The core region of the base substrate has a first gate structure and the edge region of the base substrate has a second gate structure. The disclosed fabrication method further includes forming a source/drain doped layer in the core region of the base substrate and on both sides of the first gate structure, and in the edge region of the base substrate and on both sides of the second gate structure, respectively, with first ions in the source/drain doped layers; and doping the second ions into the source/drain doped layer in the edge region. The conductivity type of the second ions is opposite to the conductivity type of the first ions.

In the disclosed fabrication method, the second ions are doped into the source/drain doped layer in the edge region after forming the source/drain doped layers in the core region of the base substrate on both sides of the first gate structure and in the edge region of the base substrate on both sides of the second gate structure. Since the second ions and the first ions in the source/drain doped layers have opposite conductivity types, the second ions can neutralize the first ions in the source/drain doped layer in the edge region, making the concentration of the first ions in the source/drain doped layer in the edge region lower than the concentration of the first ions in the source/drain doped layer in the core region. Also, the concentration gradient between the source/drain doped layer in the edge region and the channel region is lower than the concentration gradient between source/drain doped layer in the core region and the channel region. Correspondingly, the width of the depletion layer formed by the source/drain doped layer in the edge region and the channel region is larger than the width of the depletion layer formed by the source/drain doped layer in the core region and the channel region. Therefore, when the driving voltage of the semiconductor device in the edge region is larger than the driving voltage of the semiconductor device in the core region, the transverse electric field between the source/drain doped layer in the edge region and the channel region is not too large, and the tunneling leakage current problem occurring between the source/drain doped layer in the edge region and the base substrate in the edge region can be avoided. Further, the source/drain doped layer in the core region of the base substrate and the source/drain doped layer in the edge region of the base substrate are simultaneously formed, such that the process of forming a semiconductor device is simplified.

Figure 3:
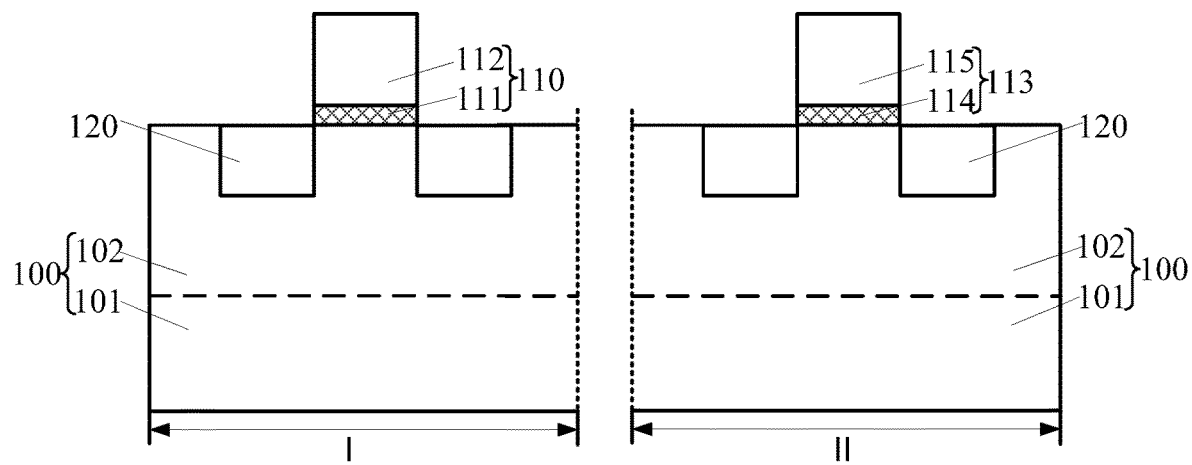
Figure 4:
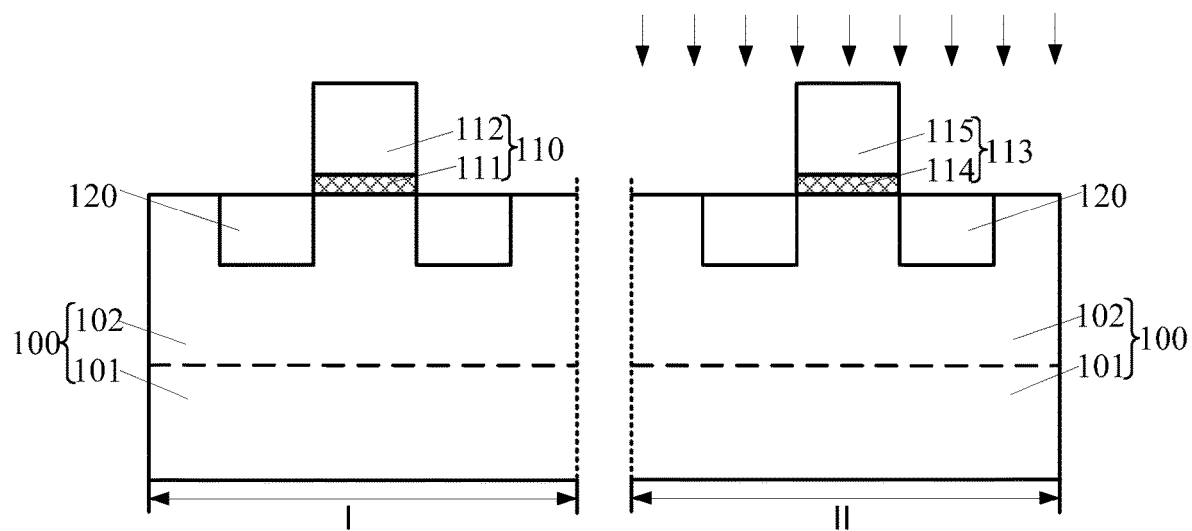
Figure 5:
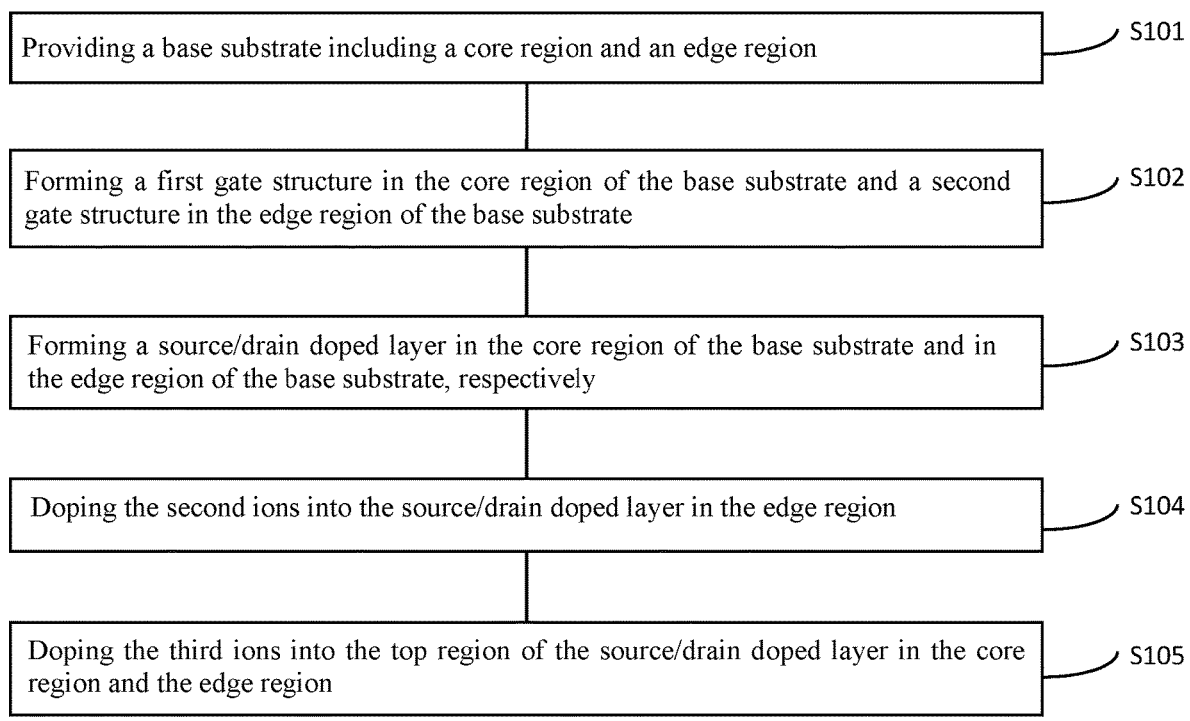
FIG. 5 illustrates an exemplary fabrication process of a semiconductor device consistent with various disclosed embodiment.

FIG. 5 illustrates an exemplary fabrication process of a semiconductor device consistent with the disclosed embodiments; and FIGS. 1~4 illustrate schematic structural views of semiconductor devices corresponding to certain stages of the exemplary fabrication process consistent with various disclosed embodiments.

As shown in FIG. 5, at the beginning of the fabrication process, a base substrate is provided, and the base substrate includes a core region and an edge region (S101).

Figure 2:
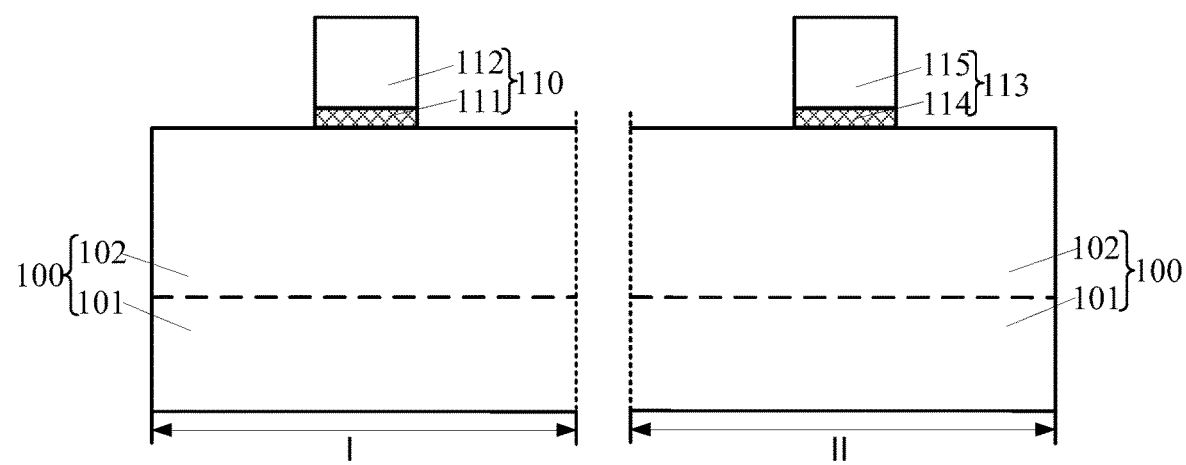

As shown in FIGS. 1 and 2, the schematic core region I in FIG. 2 corresponds to a cross-sectional profile of the portion of the semiconductor device in FIG. 1 cut along the line A1-A2, and the edge region II in FIG. 2 corresponds to a cross-sectional profile of the portion of the semiconductor device in FIG. 1 cut along the line A3-A4.

As shown in FIG. 1, a base substrate 100 is provided, and the base substrate 100 includes a core region I and an edge region II.

In one embodiment, the semiconductor device is a FinFET, and correspondingly the base substrate 100 includes a semiconductor substrate 101 and a plurality of fins 102 located on the semiconductor substrate 101.

The semiconductor substrate 101 provides a processing platform for forming a semiconductor device.

In one embodiment, the semiconductor substrate 101 is made of monocrystalline silicon. The semiconductor substrate 101 may also be made of polysilicon or amorphous silicon. The semiconductor substrate 101 may also be made of a semiconductor material such as germanium, silicon germanium, gallium arsenide.

In one embodiment, the fins 102 are formed by patterning the semiconductor substrate 101. In other embodiments, the fins may also be formed by forming a fin material layer on the semiconductor substrate and patterning the fin material layer.

In one embodiment, the semiconductor substrate 101 also has an isolation structure 103, and the isolation structure 103 covers a portion of the sidewall surface of the fins 102. The top surface of the isolation structure 103 is lower than the top surface of the fins 102.

In one embodiment, the isolation structure 103 may be made of silicon oxide.

In various embodiments, the semiconductor device may also be a planar MOS transistor, and accordingly, the base substrate is a planar semiconductor substrate.

The base substrate 100 includes a core region I and an edge region II, and the edge region II is located at the periphery of the core region I. The core region I is used to form the core device, and the edge region II is used to form the peripheral logic circuit.

Returning to FIG. 5, after providing the base substrate including a core region and an edge region, a first gate structure is formed in the core region of the base substrate and a second gate structure is formed in the edge region of the base substrate (S102).

As shown in FIGS. 1 and 2, a first gate structure 110 is formed on the base substrate 100 in the core region I, and a second gate structure 113 is formed on the base substrate 100 in the edge region II.

The first gate structure 110 includes a first gate dielectric layer 111 on the base substrate 100 in the core region I and a first gate electrode layer 112 on the first gate dielectric layer 111.

In particular, the first gate structure 110 crosses over the fins 102 in the core region I, covering a portion of the top surface and a portion of the sidewall surface of the fins 102 in the core region I. The first gate dielectric layer 111 is located on a portion of the isolation structure 103 in the core region I, covering a portion of the top surface and a portion of the sidewall surface of the fins 102 in the core region I.

The second gate structure 113 includes a second gate dielectric layer 114 on the base substrate 100 in the edge region II and a second gate electrode layer 115 on the second gate dielectric layer 114.

For example, the second gate structure 113 crosses over the fins 102 in the edge region II, covering a portion of the top surface and a portion of the sidewall surface of the fins 102 in the edge region II. The second gate dielectric layer 114 is located on a portion of the isolation structure 103 in the edge region II, covering a portion of the top surface and a portion of the sidewall surface of the fins 102 in the edge region II.

The first gate dielectric layer 111 and the second gate dielectric layer 114 are made of silicon oxide or a high K (K>3.9) dielectric material. The first gate electrode layer 112 and the second gate electrode layer 115 are made of polysilicon or metal.

In one embodiment, the first gate dielectric layer 111 and the second gate dielectric layer 114 are made of silicon oxide, and the first gate electrode layer 112 and the second gate electrode layer 115 are made of polysilicon.

Returning to FIG. 5, after forming the first gate structure and the second structure, a source/drain doped layer is formed in the core region I of the base substrate and in the edge region II of the base substrate (S103).

FIG. 3 is a schematic view based on FIG. 2. As shown in FIG. 3, a source/drain doped layer 120 is formed in the core region I of the base substrate 100 on both sides of the first gate structure 110 and in the edge region II of the base substrate 100 on both sides of the second gate structure 113, respectively. The source/drain doped layers 120 have first ions.

For example, the source/drain doped layers 120 are formed in the fins 102 of the core region I on both sides of the first gate structure 110 and in the fins 102 of the edge regions II on both sides of the second gate structure 113, respectively.

The source/drain doped layer 120 may be formed by forming a trench (not illustrated) in the core region I of the base substrate 100 on both sides of the first gate structure 110 and in the edge region II of the base substrate 100 on both sides of the second gate structure 113. That is, a trench is formed in the fins 102 in the core region I on both sides of the first gate structure 110 and in the fins 102 in the edge region II on both sides of the second gate structure 113, respectively. The first ions are doped in situ in the source/drain doped material layer while epitaxially growing the source/drain doped material layer, forming the source/drain doped layer 120.

The source/drain doped layer 120 in the core region I of the base substrate 100 and the source/drain doped layer 120 in the edge region II of the base substrate 100 are simultaneously formed, such that the process of forming the semiconductor device is simplified.

The conductivity type of the first ions is the same as the type of the semiconductor device. When the type of the semiconductor devices in the core region I and the edge region II is N-type, the conductivity type of the first ions is N-type; when the type of the semiconductor devices in the core region I and the edge region II is P-type, the conductivity type of the first ions is P-type.

When the type of the semiconductor devices in the core region I and the edge region II is N-type, the source/drain doped material layer is made of silicon carbide; when the type of the semiconductor devices in the core region I and the edge region II is P-type, the source/drain doped material layer is made of silicon germanium.

In one embodiment, a first offset sidewall spacer (not illustrated) is formed on both sidewalls of the first gate structure 110, and a second offset sidewall spacer is formed on both sidewalls of the second gate structure 113. A first lightly doped region (not illustrated) is formed in the core region I of the base substrate 100 on both sides of the first offset sidewall spacer and the first gate structure 110, and a second lightly doped region (not illustrated) is formed in the edge region II of the base substrate 100 on both sides of the second offset sidewall spacer and the gate structure 113 by using the first offset sidewall spacer and the first gate structure 110, the second offset sidewall spacer and the second gate structure 113 as a mask to lightly dope the base substrate. After forming the first lightly doped region and the second lightly doped region, a first gap sidewall spacer is formed on the first offset sidewall spacer and a second gap sidewall spacer (not illustrated) is formed on the second offset sidewall spacer. After forming the first gap sidewall spacer and the second sidewall, the source/drain doped layer 120 is formed.

The first lightly doped region and the second lightly doped region have light doped ions, and the conductivity type of the light doped ions is the same as the conductivity type of the first ions.

The concentration of the light doped ions is less than the concentration of the first ions. In particular, the concentration of the light doped ions in the first lightly doped region is less than the concentration of the first ions in the source/drain doped layer 120 of the core region. The concentration of the light doped ions in the second lightly doped region is less than the concentration of the first ions in the source/drain doped layer 120 of the edge region II.

Returning to FIG. 5, after forming the source/drain doped layer, the second ions are doped into the source/drain doped layer in the edge region (S104).

As shown in FIG. 4, the second ions are doped into the source/drain doped layer 120 in the edge region II, and the conductivity type of the second ions is opposite to the conductivity type of the first ions.

When the conductivity type of the first ions is N-type, the conductivity type of the second ions is P-type; when the conductivity type of the first ions is P-type, the conductivity type of the second ions is N-type.

Since the conductivity type of the second ions is opposite to the conductivity type of the first ions in the source/drain doped layer 120, the second ions can neutralize the first ions in the source/drain doped layer 120 in the edge region II, making the concentration of the first ions in the source/drain doped layer 120 in the edge region II lower than the concentration of the first ions in the source/drain doped layer 120 in the core region I. Thus, the concentration gradient between the source/drain doped layer 120 in the edge region II and the channel region is lower than the concentration gradient between the source/drain doped layer 120 in the core region I and the channel region. Correspondingly, the width of the depletion layer formed by the source/drain doped layer 120 in the edge region II and the channel region is larger than the width of the depletion layer formed by the source/drain doped layer 120 in the core region I and the channel region.

In a practical operation, the driving voltage of the semiconductor device in the edge region II is greater than the driving voltage of the semiconductor device in the core region I. Since the width of the depletion layer formed by the source/drain doped layer 120 in the edge region II and the channel region is larger than the width of the depletion layer formed by the source/drain doped layer 120 and the channel region, the transverse electric field between the source/drain doped layer 120 in the edge region II and the channel region is not excessively large, and the tunneling leakage current problem occurring between the source/drain doped layer 120 in the edge region II and the edge region of the base substrate 100 can be avoided.

The method of doping the second ions in the source/drain doped layer 120 in the edge region II includes forming a patterned photoresist layer covering the core region I of the base substrate 100, the source/drain doped layer 120 in the core region I and the first gate structure 110 and exposing the source/drain doped layer 120 in the edge region II; using the patterned photoresist layer as a mask and implanting the second ions into the source/drain doped layer 120 in the edge region II by an ion implantation process; and removing the patterned photoresist layer after the second ions are implanted into the source/drain doped layer 120 in the edge region II.

When the implantation energy of the ion implantation process is too large, a majority of the second ions are implanted into the fins 102 below the source/drain doped layer 120, resulting in a low efficiency use of the second ions in the source/drain doped layer 120; and when the implantation energy of the ion implantation process is too small, the second ions cannot be efficiently implanted into the source/drain doped layer 120 in the edge region II.

When the implantation dose of the ion implantation process is too large, the concentration of the second ions in the source/drain doped layer 120 is very large, resulting in a change of the conductivity type of the source/drain doped layer 120; when the implantation dose of the ion implantation process is too small, the proportion of the first ions in the source/drain doped layer 120 in the edge region II neutralized by the second ions is relatively small, and the degree of reduction in the transverse electric field between the source/drain doped layer 120 and the channel region is very low.

The implantation angle of the ion implantation process, which is the acute angle between the normal direction of the semiconductor substrate 101 and the implantation energy, is related to the implantation energy. For a certain implantation depth, the greater the implantation energy, the greater the needed implantation angle is.

As such, the implantation energy, the implantation dose, and the implantation angle of the ion implantation process need to be in a suitable range. Also, different ions have different atomic masses. For the same implantation depth, the ions with a larger atomic mass need to consume a larger amount of energy, and thus a larger implantation energy is needed.

When the conductivity type of the second ions is N-type, in one embodiment, the parameters of the ion implantation process include: the ions being phosphorus ions, the implantation energy being in a range of approximately 2 KeV~40 KeV, the implantation dose being in a range of approximately $1.0E13$ atom/cm$^2$~$5.0E15$ atom/cm$^2$, the implantation angle being in a range of approximately 0 degrees~30 degrees; in another embodiment, the parameters of the ion implantation process include: the ions being arsenic ions, the implantation energy being in a range of approximately 5 KeV~50 KeV, the implantation dose being in a range of approximately $1.0E13$ atom/cm$^2$~$5.0E15$ atom/cm$^2$, and the implantation angle being in a range of approximately 0 degrees~30 degrees.

Since the atomic mass of the arsenic ions is greater than the atomic mass of the phosphorus ions, the implantation energy of the arsenic ions is greater than the implantation energy of the phosphorous ions.

When the conductivity type of the second ions is P-type, in one embodiment, the parameters of the ion implantation process include: the ions being boron fluoride ions, the implantation energy being in a range of approximately 5 KeV~30 KeV, the implantation dose being in a range of approximately $1.0E13$ atom/cm$^2$~$5.0$ $E15$ atom/cm$^2$, the implantation angle being in a range of approximately 0~30 degrees; in another embodiment, the parameters of the ion implantation process include: the used ions being boron ions, the implantation energy being in a range of approximately 1 KeV~8 KeV, the implantation dose being in a range of approximately $1.0E13$ atom/cm$^2$~$5.0E15$ atom/cm$^2$, and the implantation angle being in a range of approximately 0 degrees to 30 degrees.

Since the total atomic mass of the boron fluoride ions is greater than the atomic mass of the boron ions, the implantation energy of the boron fluoride ions is greater than the implantation energy of the boron ions.

In one embodiment, the concentration of the second ions in the source/drain doped layer 120 in the edge region II is 10% to 50% the concentration of the first ions in the source/drain doped layer 120 in the edge region II. This is because when the concentration of the second ions in the source/drain doped layer 120 in the edge region II is less than 10% the concentration of the first ions in the source/drain doped layer 120 in the edge region II, the proportion of the second ions neutralizing the first ions in the source/drain doped layer 120 is low and the reduction of the electric field between the source/drain doped layer 120 in the edge region II and the channel region is very small; when the concentration of the second ions in the source/drain doped layer 120 in the edge region II is greater than 50% the concentration of the first ions in the source/drain doped layer 120 in the edge region II, there will be a processing waste and an increased processing difficulty.

In one embodiment, the concentration of the first ions is in a range of approximately $8E20$ atom/cm$^3$~$5.0E21$ atom/cm$^3$, and the concentration of the second ions is in a range of approximately $8.0E19$ atom/cm$^3$~$2.5E21$ atom/cm$^3$.

Returning to FIG. 5, after doping the second ions into the source/drain doped layer in the edge region, the fabrication method further includes doping the third ions into the top region of the source/drain doped layer in the core region and the edge region (S105).

In one embodiment, after doping the second ions into the source/drain doped layer in the edge region II, the third ions are doped into the top region of the source/drain doped layer 120 in the core region I and the edge region II. The conductivity type of the third ions and the conductivity type of the first ions are the same.

The effect of doping the third ions in the top region of the source/drain doped layer 120 in the core region I and the edge region II includes increasing the corresponding ion concentration of the first ions in the top region of the source/drain doped layer 120 in the core region I and the edge region II, and reducing the contact barrier between the conductive plug formed on the source/drain doped layer 120 and the source/drain doped layer 120.

The method of doping the third ions in the top region of the source/drain doped layer 120 includes an ion implantation process.

The concentration of the third ions is 40%~90% the concentration of the first ions. When the concentration of the third ions is greater than 90% the concentration of the first ions, there will be an increase of the processing difficulty and a processing waste; when the concentration of the third ions is less than 40% the concentration of the first ions, the reduction of the contact barrier between the conductive plug formed on the source/drain doped layer 120 and the source/drain doped layer 120 will be very small.

In one embodiment, the concentration of the third ions is in a range of approximately 6.0E20 atom/cm$^3$~4.0E21 atom/cm$^3$.

In one embodiment, the second ions are doped in the source/drain doped layer 120 in the edge region II, followed by an annealing process.

For example, the annealing process is performed after the third ions are doped in the top region of the source/drain doped layer 120 in the core region I and the edge region II.

The effect of the annealing process includes activating the first ions and the second ions and activating the third ions.

In other embodiments, an annealing process is performed after the second ions are doped in the source/drain doped layer 120 in the edge region II and before the third ions are doped in the top region of the source/drain doped layer 120 in the core region I and the edge region II, and is also performed after the third ions are doped in the top region of the source/drain doped layer 120 in the core region I and the edge region II, respectively.

Accordingly, the present disclosure also provides a semiconductor device formed by the disclosed fabrication method of a semiconductor device.

As such, the present disclosure provides a method to improve the performance of a FinFET device by doping second ions into the source/drain doped layer in the edge region and neutralizing the first ions in the source/drain doped layer in the edge region.

In an exemplary embodiment, the first ions are N-type phosphorous ions and the second ions are P-type boron ions. The concentration of the first ions is in a range of approximately 8E20 atom/cm$^3$~1.8E21 atom/cm$^3$, and the concentration of the second ions is in a range of approximately 3E20 atom/cm$^3$~1E21 atom/cm$^3$. The implantation energy of the ion implantation process for the boron counter-doping process is in a range of approximately 2 KeV~8 KeV, and the implantation angle is approximately 0 degrees.

Compared with the conventional technology, the fabrication method in the present disclosure has the following advantages:

According to the method of forming a semiconductor device in the present disclosure, after forming the source/drain doped layers in the core region of the base substrate on both sides of the first gate structure and in the edge region of the base substrate on both sides of the second gate structure, the second ions are doped into the source/drain doped layer in the edge region. Because the conductivity type of the second ions and the conductivity of the first ions in the source/drain doped layer are opposite, the second ions can neutralize the first ions in the source/drain doped layer in the edge region, such that the ion concentration of the first ions in the source/drain doped layer in the edge region is relatively low compared to the ion concentration of the first ions in the source/drain doped layer in the core region. Correspondingly, the concentration gradient between the source/drain doped layer in the edge region and the channel region is relatively low compared to the concentration gradient between the source/drain doped layer in the core region and the channel region. Also, the width of the depletion layer formed by the source/drain doped layer in the edge region and the channel region is larger than the width of the depletion layer formed by the source/drain doped layer in the core region and the channel region. Therefore, when the driving voltage of the semiconductor device in the edge region is larger than the driving voltage of the semiconductor device in the core region, the transverse electric field between the source/drain doped layer in the edge region and the channel region is not excessively large, and the tunneling leakage current problem occurring between the source/drain doped layer in the edge region and the edge region of the base substrate is avoided. Further, the source/drain doped layer in the core region of the base substrate and the source/drain doped layer in the edge region of the base substrate are simultaneously formed so that the process of forming the semiconductor device is simplified.

The above detailed descriptions only illustrate certain embodiments of the disclosed disclosure, and are not intended to limit the scope of the disclosed disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method of forming a semiconductor device, comprising:
    providing a base substrate including a core region having a first gate structure formed thereon, and an edge region having a second gate structure formed thereon;
    forming a source/drain doped layer, in the core region of the base substrate on both sides of the first gate structure, and in the edge region of the base substrate on the both sides of the second gate structure simultaneously, the source/drain doped layer including first ions;
    doping second ions in the source/drain doped layer in the edge region to neutralize the first ions in the edge region without doping the second ions in the source/drain doped layer in the core region, the second ions having a conductivity type opposite to the first ions and a concentration of the first ions in the source/drain doped layer in the edge region being lower than a concentration of the first ions in the source/drain doped layer in the core region, wherein a concentration gradient between the source/drain doped layer in the edge region and a channel region in the edge region is smaller than a concentration gradient between the source/drain doped layer in the core region and a channel region in the core region;

performing a first annealing process after doping the second ions in the source/drain doped layer of the edge region;

after forming the second ions in the source/drain doped layer of the edge region and the annealing process, doping third ions into a top region of the source/drain doped layer in the core region and the edge region, the third ions having a conductivity type same as the first ions; and performing a second annealing process after doping the third ions in the top region of the source/drain doped layer of the core region and the edge region, respectively.

2. The method according to claim 1, wherein doping the second ions in the source/drain doped layer in the edge region comprising:

forming a patterned photoresist layer covering the base substrate in the core region, the source/drain doped layer in the core region and the first gate structure, and exposing a portion of the source/drain doped layer in the edge region;

using the patterned photoresist layer as a mask to implant the second ions in the portion of the source/drain doped layer in the edge region by an ion implantation process; and removing the patterned photoresist layer after implanting the second ions in the source/drain doped layer of the edge region.

3. The method according to claim 2, wherein:
the conductivity type of the second ions is P-type when the conductivity type of the first ions is N-type.

4. The method according to claim 3, wherein the ion implantation process includes:
boron fluoride ions, having implantation energy in a range approximately from 5 KeV to 30 KeV, an implantation dose in a range approximately from $1.0E13$ atom/cm$^2$ to $5.0E15$ atom/cm$^2$, and an implantation angle in a range approximately from 0 to 30 degrees.

5. The method according to claim 3, wherein the ion implantation process includes:
boron ions, having implantation energy in a range approximately from 1 KeV to 8 KeV, an implantation dose in a range approximately $1.0E13$ atom/cm$^2$~$5.0E15$ atom/cm$^2$, and an implantation angle in a range approximately from 0 degrees to 30 degrees.

6. The method according to claim 2, wherein:
the conductivity type of the second ions is N-type when the conductivity type of the first ions is P-type.

7. The method according to claim 6, wherein the ion implantation process includes:
phosphorus ions, having implantation energy in a range approximately from 2 KeV to 40 KeV, an implantation dose in a range approximately from $1.0E13$ atom/cm$^2$~$5.0E15$ atom/cm$^2$, and an implantation angle in a range approximately from 0 degrees to 30 degrees.

8. The method according to claim 6, wherein the ion implantation process includes:
arsenic ions, having implantation energy in a range approximately 5 KeV~50 KeV, an implantation dose in a range approximately $1.0E13$ atom/cm$^2$~$5.0E15$ atom/cm$^2$, and an implantation angle in a range approximately from 0 degrees to 30 degrees.

9. The method according to claim 1, wherein:
a concentration of the second ions in the source/drain doped layer is approximately 10%~50% a concentration of the first ions in the source/drain doped layer in the edge region.

10. The method according to claim 9, wherein:
the concentration of the first ions is approximately $8E20$ atom/cm$^3$~$5.0E21$ atom/cm$^3$, and
the concentration of the second ions is approximately $8.0E19$ atom/cm$^3$ to $2.5E21$ atom/cm$^3$.

11. The method according to claim 1, further comprising:
forming a first offset sidewall spacer on both sidewalls of the first gate structure;

forming a second offset sidewall spacer on both sidewalls of the second gate structure;

using the first offset sidewall spacer and the first gate structure, and the second offset sidewall spacer and the second gate structure as a mask to lightly dope the base substrate, to form a first lightly doped region in the core region of the base substrate on both sides of the first offset sidewall spacer and the first gate structure and to form a second lightly doped region in the edge region of the base substrate on both sides of the second offset sidewall spacer and the second gate structure;

forming a first gap sidewall spacer located on the first offset sidewall spacer and a second gap sidewall spacer on the second offset sidewall spacer after forming the first lightly doped region and the second lightly doped region; and forming the source/drain doped layer after forming the first gap sidewall spacer and the second gap sidewall spacer.

12. The method according to claim 11, further comprising:
a concentration of light doped ions in the first lightly doped region and the second lightly doped region is less than the concentration of the first ions in the source/drain doped layer in the core region.

13. The method according to claim 1, wherein forming the source/drain doped layer includes:
forming a trench in the core region of the base substrate on both sides of the first gate structure and in the edge region of the base substrate on both sides of the second gate structure;

epitaxially growing a source/drain doped material layer in the trench; and forming the source/drain doped layer by in situ doping the first ions in the source/drain doped material layer while epitaxially growing the source/drain doped material layer.

14. The method according to claim 1, wherein:
doping the third ions in the top region of the source/drain doped layer includes an ion implantation process.

15. The method according to claim 1, wherein:
a concentration of the third ions is approximately 40%~90% the concentration of the first ions.

16. The method according to claim 15, wherein:
the concentration of the third ions is in a range of approximately $6.0E20$ atom/cm$^3$~$4.0E21$ atom/cm$^3$.

17. The method according to claim 1, further comprising:
an annealing process is performed to activate the first ions, the second ions, and the third ions after doping the third ions into the top region of the source/drain doped layer in the core region and the edge region.

18. A semiconductor device, comprising:
a base substrate including a core region and an edge region;
a first gate structure on the core region of the base substrate and a second gate structure on the edge region of the base substrate;
a first source/drain doped layer on both sides of the first gate structure and in the core region of the base substrate, wherein the first source/drain doped layer includes first ions;
a second source/drain doped layer on both sides of the second gate structure in the edge region of the base substrate, wherein a first annealing process is performed after doping the second ions in the source/drain doped layer of the edge region, the second source/drain doped layer is not located in the source/drain doped layer in the core region, the second source/drain doped layer includes the first ions and second ions having a conductivity opposite to the first ions to neutralize the first ions in the edge region and a concentration of the first ions in the source/drain doped layer in the edge region being lower than a concentration of the first ions in the source/drain doped layer in the core region, wherein a concentration gradient between the source/drain doped layer in the edge region and a channel region in the edge region is smaller than a concentration gradient between the source/drain doped layer in the core region and a channel region in the core region; and
a third source/drain doped layer on a top region of the source/drain doped layer in the core region and the edge region, wherein the third source/drain doped layer includes third ions and a second annealing process is performed after doping the third ions in the top region of the source/drain doped layer of the core region and the edge region, respectively.

19. The semiconductor device according to claim 18, wherein the third ions have a conductivity type same as the first ions.

20. The semiconductor device according to claim 19, further comprising:
a concentration of the second ions in the source/drain doped layer is approximately 10%~50% a concentration of the first ions in the second source/drain doped layer in the edge region, and
a concentration of the third ions is approximately 40%~90% the concentration of the first ions.

* * * * *